(12) United States Patent
Pethe et al.

(10) Patent No.: US 11,769,673 B2
(45) Date of Patent: Sep. 26, 2023

(54) SEMICONDUCTOR WAFER PROCESSING SYSTEM

(71) Applicant: GLOBALFOUNDRIES U.S. Inc., Santa Clara, CA (US)

(72) Inventors: Wieland Pethe, Dresden (DE); Dirk Noack, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 271 days.

(21) Appl. No.: 17/176,156

(22) Filed: Feb. 15, 2021

(65) Prior Publication Data
US 2022/0262648 A1 Aug. 18, 2022

(51) Int. Cl.
*H01L 21/687* (2006.01)
*H01L 21/324* (2006.01)
*H01L 21/67* (2006.01)

(52) U.S. Cl.
CPC ...... *H01L 21/324* (2013.01); *H01L 21/67103* (2013.01); *H01L 21/68785* (2013.01)

(58) Field of Classification Search
CPC ............. H01L 21/324; H01L 21/67103; H01L 21/68785
See application file for complete search history.

(56) References Cited

U.S. PATENT DOCUMENTS

| 6,513,796 | B2 | 2/2003 | Leidy et al. |
| 8,336,188 | B2 | 12/2012 | Monteen et al. |
| 2012/0171875 | A1 | 7/2012 | Gan et al. |
| 2018/0193983 | A1* | 7/2018 | Ishino ................. H01L 21/6838 |
| 2020/0203208 | A1* | 6/2020 | Pethe ................. H01L 21/67098 |
| 2020/0248306 | A1* | 8/2020 | Toriya ................... C23C 16/466 |
| 2021/0074574 | A1* | 3/2021 | Ji ...................... H01L 21/68735 |

FOREIGN PATENT DOCUMENTS

KR 20080030716 A 4/2008

* cited by examiner

*Primary Examiner* — David Vu
*Assistant Examiner* — Brandon C Fox
(74) *Attorney, Agent, or Firm* — David Cain

(57) ABSTRACT

The embodiments herein relate to methods for processing a wafer through a semiconductor wafer processing system and an apparatus. According to an aspect of the present disclosure, a system for processing a semiconductor wafer is provided. The system includes a heating system, a pressure control system, and a gas flow system. The heating system is configured for heating a chuck. The pressure control system is configured for setting an internal chamber pressure. The gas flow system is configured for inflowing a gas in the process chamber to increase the internal chamber pressure to at least a base pressure. The heating system heats the chuck after the internal chamber pressure reaches the base pressure set by the pressure control system.

18 Claims, 4 Drawing Sheets

SEMICONDUCTOR WAFER PROCESSING SYSTEM

FIELD OF INVENTION

The present disclosed subject matter relates to a semiconductor wafer processing system and methods for processing a wafer through such a system.

BACKGROUND

In semiconductor product manufacturing, semiconductor wafers are processed to form integrated circuits thereon. Wafers having a substantially flat wafer surface topography are generally desired as semiconductor processing tools are designed to process the wafers as such. For example, photolithography tools and processes are designed to image on wafers having a substantially flat wafer surface topography in order to focus on the wafer surfaces. When the warping or the degree of non-flatness of the wafer surface exceeds the range of the depth of focus (DOF) of the photolithography system, a mask pattern imaged will be out of focus in at least some regions on the wafer. This can result in defects in the subsequent processing and lead to the fabrication of defective semiconductor devices.

While unprocessed semiconductor wafers may be initially unstrained, subsequent wafer processing may undesirably warp the wafers. Wafer warpage may occur due to the different thermal responses of materials that are formed on the wafer. The different materials having different coefficients of thermal expansion will expand/contract at different rates when heated. When the warpage of the wafer exceeds an acceptable degree, the wafer may be non-uniformly heated, thereby adversely impacting the reliability of the semiconductor devices.

Therefore, it is desirable to provide methods for processing a wafer through a processing system and an apparatus to overcome, or at least ameliorate, the disadvantage described above. Furthermore, other desirable features and characteristics will become apparent from the subsequent detailed description and the appended claims, taken in conjunction with the accompanying drawings and this background of the disclosure.

SUMMARY

To achieve the foregoing and other aspects of the present disclosure, methods for processing a wafer through a semiconductor wafer processing system and an apparatus are presented.

According to an aspect of the present disclosure, a system for processing a semiconductor wafer is provided. The system includes a heating system, a pressure control system, and a gas flow system. The heating system is configured for heating a chuck. The pressure control system is configured for setting an internal chamber pressure. The gas flow system is configured for inflowing a gas in the process chamber to increase the internal chamber pressure to at least a base pressure. The heating system heats the chuck after the internal chamber pressure reaches the base pressure set by the pressure control system.

According to another aspect of the present disclosure, a method for processing a semiconductor wafer is provided. The method includes providing a process chamber having a chuck therein. An internal chamber pressure of the process chamber is set to at least a base pressure. The chuck is heated after the process chamber reaches the base pressure.

According to yet aspect of the present disclosure, a semiconductor processing tool is provided. The tool includes a process chamber and a chuck in the process chamber. The process chamber is configured for a high-pressure wafer processing operation, wherein an internal chamber pressure can be set to at least a base pressure higher than an ambient pressure. The chuck has grooves in the chuck surface that terminate in the chuck. The grooves form air pockets when a wafer is placed on the chuck and the air pockets have an air pressure lower than the base pressure.

BRIEF DESCRIPTION OF THE DRAWINGS

The embodiments of the present disclosure will be better understood from a reading of the following detailed description, taken in conjunction with the accompanying drawings.

Figure 1:
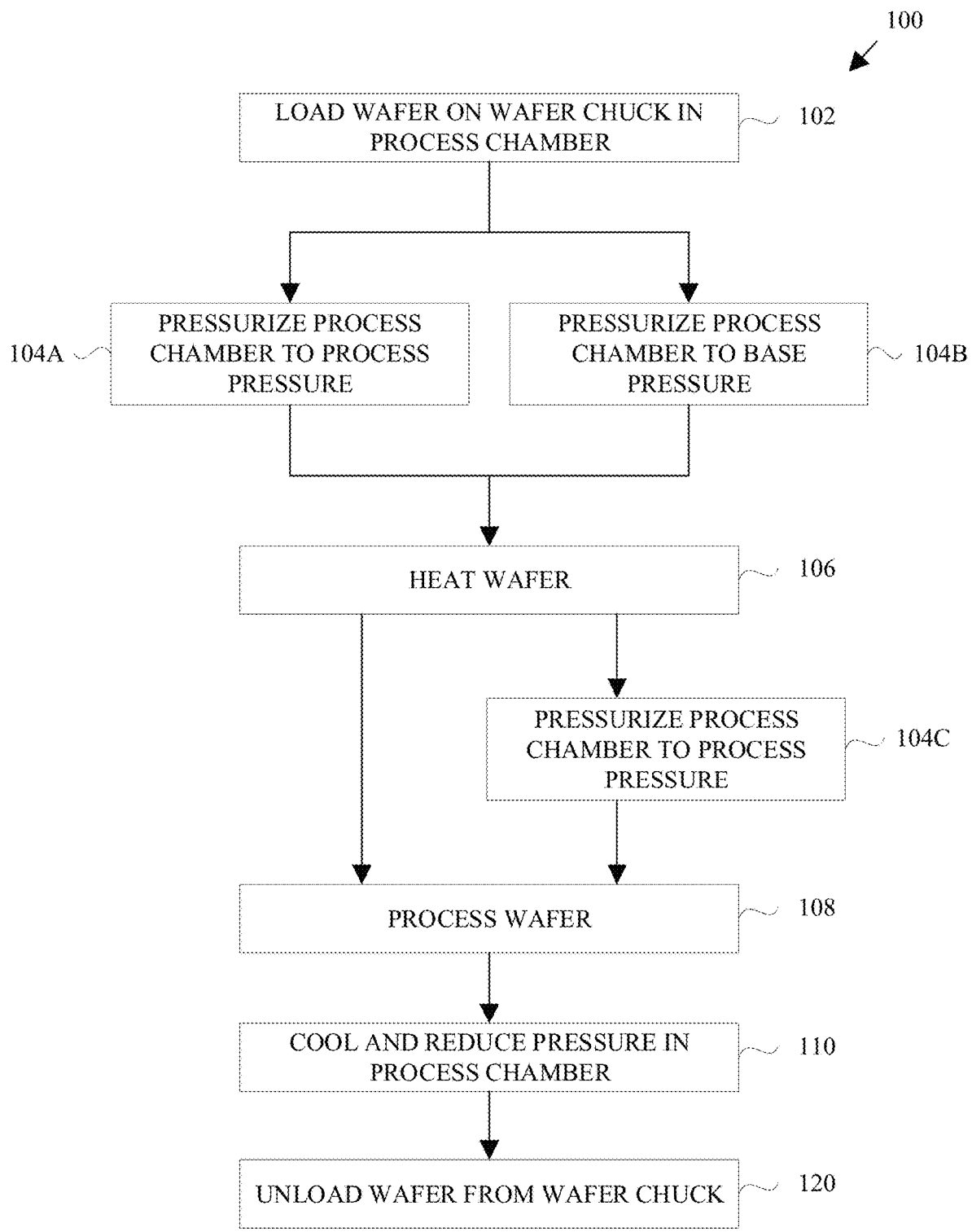
FIG. 1 is a flow chart illustrating a method for processing a wafer through a processing system, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure. Certain structures may be conventionally fabricated, for example, using known processes and techniques, and specifically disclosed processes and methods may be used to achieve individual aspects of the present disclosure.

The disclosure relates to a semiconductor processing system and methods for processing a wafer through such a system and an apparatus. A wafer may include a plurality of semiconductor devices fabricated thereupon.

The plurality of semiconductor devices may be partially processed. Those skilled in the art should readily appreciate that the term "partially-processed wafer" refers to semiconductor devices on a semiconductor wafer during any of the various stages of semiconductor product manufacturing to form a variety of different semiconductor devices, including, but not limited to, logic devices, memory devices, etc., and the devices may be either NFET or PFET devices.

The wafer may include a variety of configurations, such as a bulk silicon configuration or a semiconductor-on-insulator (SOI) configuration. The wafer may include any appropriate semiconductor material, such as silicon, silicon germanium, silicon carbon, other II-VI or III-V semiconductor compounds, and the like. Thus, the terms "semiconductor wafer", "wafer", "semiconductor substrate", and "substrate" should be understood to cover all forms of such materials. The wafer may include semiconductor substrates having diameters of 200, 300, and 450 mm. However, the present disclosure is not limited to this and the wafers can have various shapes, sizes, and materials.

FIG. 1 is a flow chart 100 illustrating a method for processing a wafer through a semiconductor wafer processing system, according to an embodiment of the disclosure. The processing system may include, among other things, a processing tool with a process chamber, a wafer handling system, a wafer chuck, a wafer heating system, a pressure control system, and a gas flow system. The processing tool may be used as one part of an elaborate fabrication process to manufacture semiconductor wafers into functional semiconductor devices and various integrated circuit products.

The wafer may be processed in the process chamber and may have a plurality of partially processed semiconductor devices formed thereupon. The wafer processing operation may include a high-pressure process operation such as, but not limited to, a diffusion process or an annealing process. As used herein, the term "high-pressure process operation" refers to a process operation that employs a pressure level greater than an ambient pressure of the surroundings in which the processing tool is located.

The wafer to be processed may be loaded in the process chamber; the process is illustrated as operation 102 in the flow chart 100 shown in FIG. 1. The wafer may be placed on the wafer chuck that is enclosed within the process chamber using the wafer handling system. The internal chamber pressure of the process chamber may be substantially equivalent to the ambient pressure. In an embodiment of the disclosure, the ambient pressure may be substantially equivalent to the atmospheric pressure of the surroundings.

The process chamber may be pressurized by introducing a pressurizing gas into the process chamber through the gas flow system after the wafer has been placed on the wafer chuck; the process is illustrated as operations 104A and 104B in the flow chart 100 shown in FIG. 1. The gas flow system may be controlled by the pressure control system. The pressure control system is capable of setting the internal chamber pressure to a predetermined pressure level and controls the amount of pressurizing gas inflowing to the process chamber. The pressure control system sets the process chamber to an internal chamber pressure greater than the ambient pressure. As the pressurizing gas fills the process chamber, the confined pressurizing gas exerts a force against the inner surfaces of the process chamber, including against the wafer that is placed on the wafer chuck. This force advantageously holds the wafer in place as long as the pressurizing gas is not exhausted. In an embodiment of the disclosure, the process chamber 202 may further include a venting means to operatively cooperate with the pressure control system to control the internal chamber pressure.

The pressurizing gas may include a process gas that may be used in the wafer processing operation or an inert gas if no process gas is required for the wafer processing operation. In an embodiment of the disclosure, the pressurizing gas may include hydrogen, deuterium, argon, or gases containing fluorine, chlorine, or nitrogen.

In an embodiment of the disclosure, the internal chamber pressure may be set to a process pressure that is required for the wafer processing operation; the process is illustrated as operation 104A in the flow chart 100 shown in FIG. 1. In an embodiment of the disclosure, the internal chamber pressure in the process chamber may be set to a base pressure that is lower than the process pressure but higher than the ambient pressure; the process is illustrated as operation 104B in the flow chart 100 shown in FIG. 1. The base pressure may be a predetermined pressure level that is sufficient to hold the wafer stationary on the wafer chuck. For example, the base pressure may be 0.2 MPa.

A thermal operation may be performed on the wafer using the wafer heating system; the process is illustrated as operation 106 in the flow chart 100 shown in FIG. 1. The wafer heating system may include a heating element in the wafer chuck. The wafer may be heated to a process temperature that is required for the wafer processing operation after the process chamber reaches the predetermined pressure level set by the pressure control system. The wafer heating system activates the heating element in the wafer chuck which in turn heats the wafer that is placed thereupon. The increased internal chamber pressure, besides fixating the wafer on the wafer chuck for the wafer processing operation, advantageously provides a uniform downward force on the upper wafer surface that impedes the warpage of the wafer during the thermal operation, thereby enabling uniform heating of the wafer by the wafer chuck.

The wafer may undergo a wafer processing operation; the process is illustrated as operation 108 in the flow chart 100 shown in FIG. 1. The wafer processing operation may include a high-pressure process operation such as, but not limited to, a diffusion process or an annealing process. It is understood that the internal chamber pressure may be set to the required process pressure for the wafer processing operation, as provided by operation 104C, in the event where the internal chamber pressure was initially increased to the base pressure at operation 104B instead of to the process pressure at operation 104A.

The process chamber may be cooled and the increased internal chamber pressure may be released after completion of the wafer processing operation; the process is illustrated as operation 110 in the flow chart 100 shown in FIG. 1. The process chamber may be cooled to an idling temperature by deactivating the wafer heating system and the increased internal chamber pressure may be released by exhausting the pressurizing gas through the gas flow system. The internal chamber pressure is reverted to a pressure level that is substantially equivalent to the ambient pressure such that the wafer can be unloaded from the wafer chuck at operation 120 using the wafer handling system and proceed to the next wafer processing operation.

The order in which any operations described in the flow chart 100 of FIG. 1 is not intended to be construed as a limitation, and any number of the described operations can be combined in any order to implement the method. For example, operations 106 and 108 may be performed concurrently and in parallel. Additionally, individual operations may be removed from the process without departing from the spirit and scope of the subject matter described herein. Furthermore, the method may be implemented in any suitable hardware, software, firmware, or a combination thereof, without departing from the scope of the invention.

Figure 2:
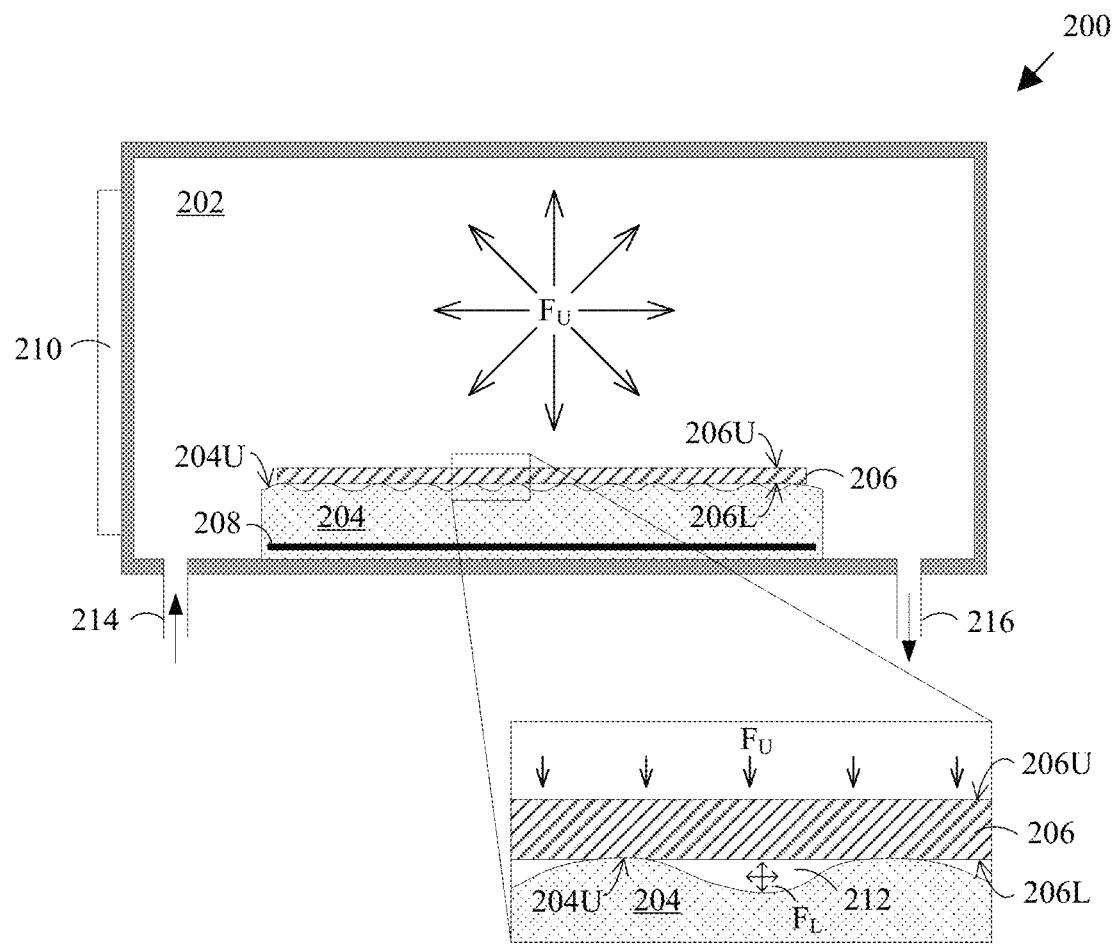
FIG. 2 is a cross-sectional view of a process chamber having a wafer chuck therein, according to an embodiment of the disclosure.

FIG. 2 illustrates a cross-sectional view of a process chamber 202 enclosing a wafer chuck 204 therein, according to an embodiment of the disclosure. The wafer chuck 204 may be configured for the placement of a wafer 206 for processing in the process chamber 202. The wafer chuck 204 may operatively cooperate with a wafer heating system, such as a heating element 208 in the wafer chuck 204, to heat the wafer chuck 204, which in turn heats the wafer 206, as similarly described in operation 106 of FIG. 1. The wafer chuck 204 may be annular in shape that conforms to the generally annular shape of wafers. However, the disclosure is not limited to an annular-shaped wafer chuck and the wafer chuck may take on other configurations without departing from the spirit and scope of the present disclosure.

The wafer chuck 204 may be enclosed within the process chamber 202 that is part of a semiconductor processing tool. The process chamber 202 may include a door 210 to transfer the wafer 206 into the process chamber 202 for processing and out of the process chamber 202 upon completion of a wafer processing operation. In an embodiment of the disclosure, the process chamber 202 may include a process chamber configured for high-pressure wafer processing operations.

The wafer 206 may be loaded into the process chamber 202 through the door 210 using a wafer handling system and be placed on an upper surface of the wafer chuck 204U, as similarly described in operation 102 of FIG. 1. During the loading of the wafer 206 into the process chamber 202, the internal chamber pressure of the process chamber 202 may be substantially equivalent to the ambient pressure.

The wafer chuck 204 may have an uneven upper wafer chuck surface 204U, as illustrated in FIG. 2. When the wafer 206 is placed on the wafer chuck 204, air gaps 212 may be formed between the upper wafer chuck surface 204U and the lower wafer surface 206L. Although referred to as "air" gaps in this disclosure, the elemental composition of the air can include different gases and should not be construed as having any particular elemental composition. In accordance with the present disclosure, the air gaps are voids where no solid material is present. Any number and type of gases may be present in the air gaps.

The air gaps 212 may have an air pressure that is substantially equivalent to the ambient pressure. Since the internal chamber pressure may be substantially equivalent to the ambient pressure, the force $F_U$ exerted on the upper wafer surface 206U by the internal chamber pressure may be expected to be substantially equivalent to the force $F_L$ exerted on the lower wafer surface 206L by the air pressure of the air gaps 212, i.e., $F_U = F_L$. Therefore, the wafer 206 may be easily displaced and not fixated on the wafer chuck.

The process chamber 202 may include a gas flow system having an inlet 214 to receive a pressurizing gas and an outlet 216 to exhaust the pressurizing gas. The gas flow system may be controlled by the pressure control system. The pressure control system is capable of setting the internal chamber pressure to a predetermined pressure level and controls the amount of pressurizing gas inflowing to the process chamber. The pressurizing gas may flow into the process chamber 202 through the inlet 214 to increase the internal chamber pressure to a pressure level predetermined by the pressure control system. The predetermined pressure level may be greater than the ambient pressure, as similarly described in operations 104A, 104B, and 104C of FIG. 1. In an embodiment of the disclosure, the process chamber 202 may further include a venting means to operatively cooperate with the pressure control system to control the internal chamber pressure.

When the pressurizing gas increases the internal chamber pressure, the force $F_U$ exerted on the inner surfaces of the process chamber 202, including against the upper wafer surface 206U increases with the increasing internal chamber pressure. The force $F_U$ is greater than the force $F_L$ exerted on the lower wafer surface 206L by the air pressure of the air gaps 212, i.e., $F_U > F_L$. As the wafer 206 is subjected to a greater force $F_U$ from the increased internal chamber pressure, the air gaps 212 operatively cooperate with the increased internal chamber pressure to securely fixate the wafer 206 on the wafer chuck 204.

Upon completion of the wafer processing operation, the pressurizing gas may be exhausted through the outlet 216 and the internal chamber pressure reverts to a pressure level that is substantially equivalent to the ambient pressure. The wafer 206 may be unloaded from the wafer chuck 204 and proceed to the next wafer processing operation.

Figure 3:
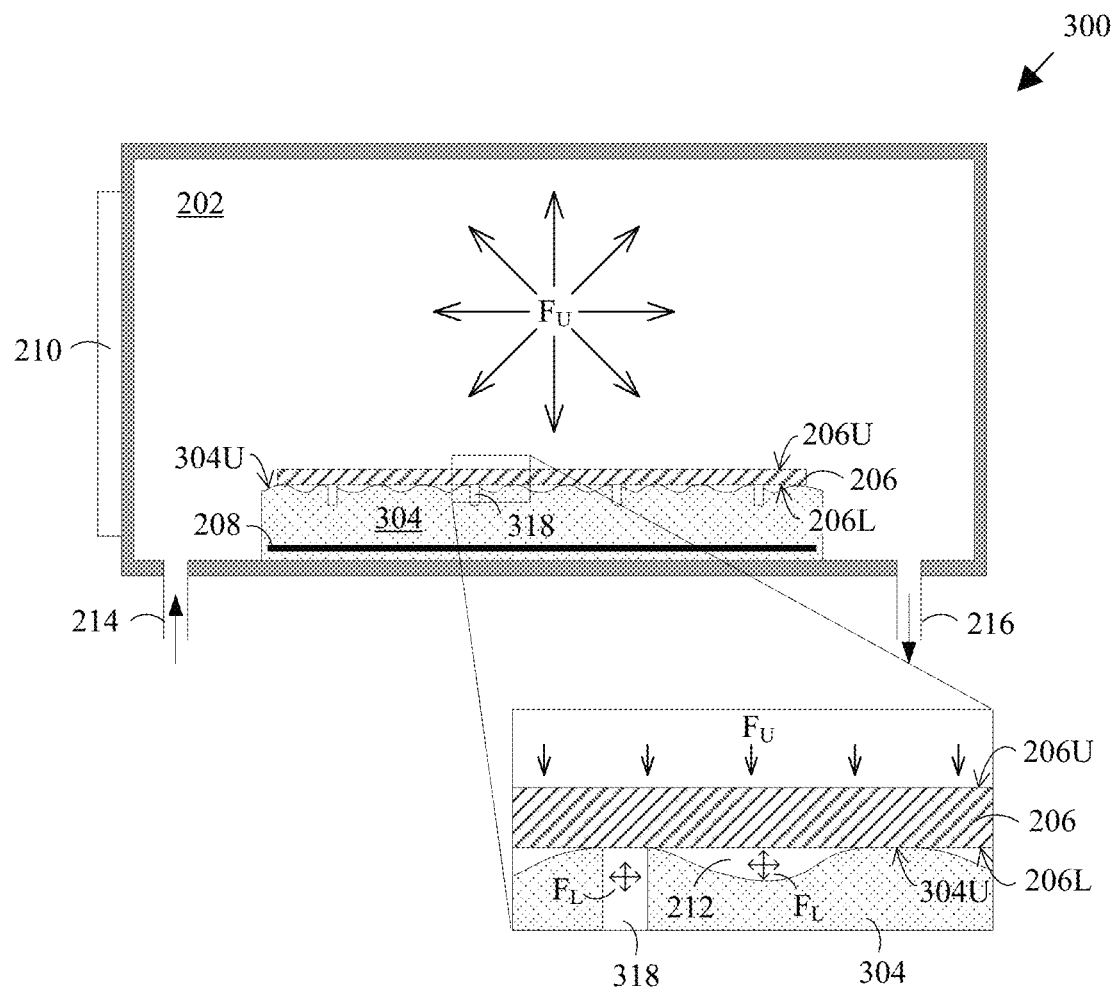
FIG. 3 is a cross-sectional view of a process chamber having a wafer chuck therein, according to another embodiment of the disclosure.

FIG. 3 illustrates a cross-sectional view of a process chamber 202 enclosing a wafer chuck 304 therein, according to another embodiment of the disclosure. Similar to the wafer chuck 204 in FIG. 2, the wafer chuck 304 may be configured for placement of a wafer 206 for processing. The wafer chuck 304 may also include a heating element 208 to heat the wafer chuck 304 and the wafer 206, as similarly described in operation 106 of FIG. 1.

The difference between the wafer chuck 204 in FIG. 2 and the wafer chuck 304 in FIG. 3 lies in that the wafer chuck 304 has grooves 318 formed therein. The grooves 318 may have a bigger volume than the air gaps 212 and may extend from the upper wafer chuck surface 304U and terminate within the wafer chuck 304 such that the grooves 318 do not extend through the wafer chuck 304. Even though four grooves are being illustrated in FIG. 3, it is understood that any number of grooves may be formed in the wafer chuck.

When the wafer 206 is placed on the wafer chuck 304, air pockets are formed in the grooves 318. Similar to the air gaps 212, the air pockets may have an air pressure that is substantially equivalent to the ambient pressure. When the internal chamber pressure increases due to the inflow of the pressurizing gas, the air pressure of the air pockets being lower than the internal chamber pressure, the force $F_U$ exerted on the upper wafer surface 206U is, therefore, greater than the force $F_L$ exerted by the air pockets (and the air gaps 212), i.e., $F_U > F_L$. The air pockets (and the air gaps 212) operatively cooperate with the increased internal chamber pressure to securely fixate the wafer 206 on the wafer chuck 304. The grooves 318 may be expected to further impede any potential displacement of the wafer 206 from the wafer chuck 304.

Figure 4:
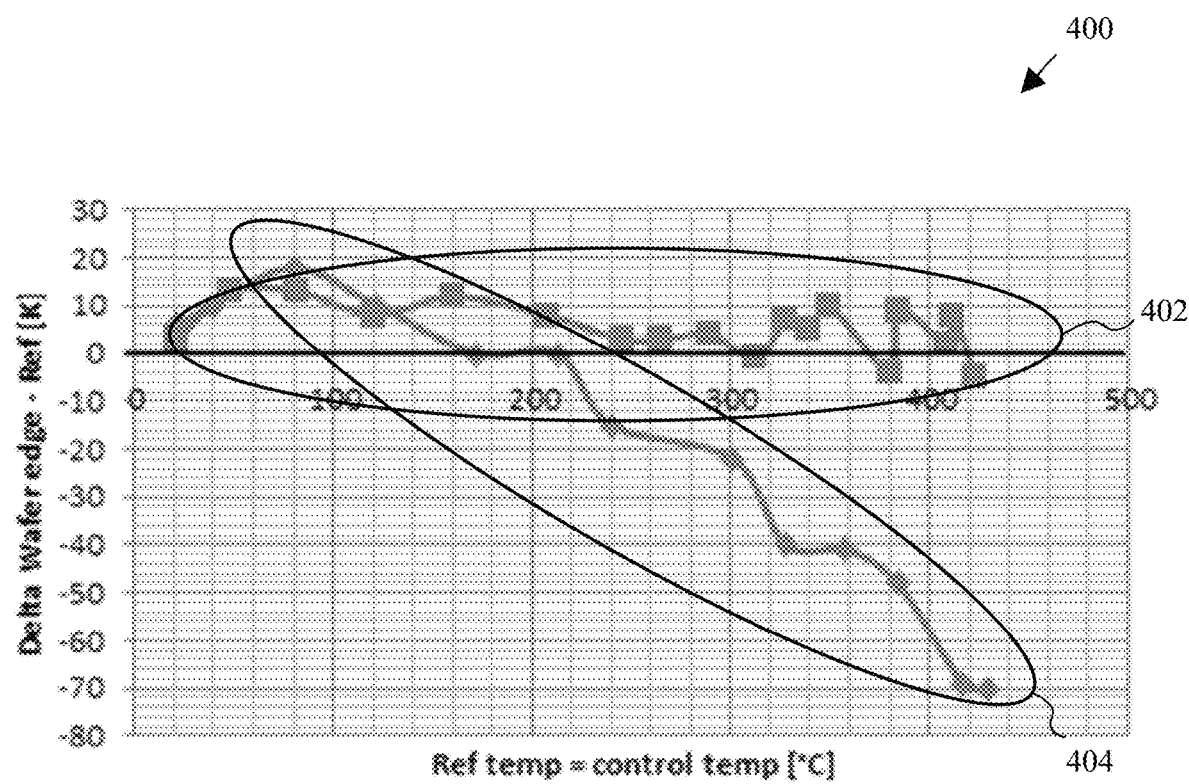
FIG. 4 is a graph illustrating a temperature difference between a wafer and a reference when subjected to a thermal operation on a wafer chuck, according to an embodiment of the disclosure.

FIG. 4 is a graph 400 illustrating a temperature difference between a wafer and a reference when subjected to a thermal operation on a wafer chuck in a process chamber, according to an embodiment of the disclosure. The wafer is loaded on the wafer chuck and the reference, in a form of an unprocessed wafer chip, is placed on the wafer chuck in close proximity to the wafer. The wafer and the reference are heated from an ambient temperature to a reference temperature of about 420° C. and the temperatures at the wafer edge and the reference are being measured throughout the thermal operation.

The amount of wafer warpage may be indirectly visible from the temperature difference recorded between the wafer and the reference throughout the thermal operation. For example, wafer warpage occurs when the wafer is non-uniformly heated, thereby resulting in a greater temperature difference between the wafer and the reference.

Group 402 illustrates the temperature difference between the wafer and the reference across the range of reference temperature when the wafer was loaded into the process chamber and heated using the method disclosed in the present disclosure. The process chamber was pressurized to at least a base pressure after loading the wafer on the wafer chuck and before heating the wafer. As illustrated, the temperature difference recorded in Group 402 is relatively narrow. This indicates that the wafer was uniformly heated by the wafer chuck, and minimal wafer warpage was induced during the thermal operation.

Group 404 illustrates the temperature difference between another wafer and the reference across the range of reference temperature when the wafer was loaded into the process chamber and heated without pressurizing the process chamber to at least a base pressure before heating the wafer. The temperature difference recorded in Group 404, on the other hand, is substantially wider than the temperature difference recorded in Group 402. This indicates the wafer was non-uniformly heated by the wafer chuck, and there was substantial wafer warpage induced due to the non-uniform heating. It is further noted that there is an increasing temperature difference recorded with increasing reference temperature and the greatest temperature difference is recorded at the peak of about 420° C., which is a typical process temperature of a high-pressure wafer processing operation. This further indicates that the wafer is substantially warped when heated to that temperature.

Therefore, the embodiments as described above result in advantages, such as but not limited to, minimized inducement of wafer warpage and uniform heating of the wafer during a wafer processing operation.

As presented in the above disclosure, methods for processing a wafer through a processing system and an apparatus are presented. The processing system may include a processing tool with a process chamber, a wafer handling system, a wafer chuck, a wafer heating system, a pressure control system, and a gas flow system. The processing system may be configured for a high-pressure wafer processing operation. The high-pressure wafer processing operations may include but are not limited to, a diffusion process or an annealing process.

The methods include loading the wafer on the wafer chuck enclosed within the process chamber and pressurizing the process chamber by inflowing a pressurizing gas to at least a pressure level that is greater than the ambient pressure using the gas flow system. The gas flow system may be controlled by a pressure control system that controls the amount of pressurizing gas inflowing to the process chamber. The increased internal chamber pressure securely fixates the wafer on the wafer chuck as long as the pressurizing gas is not exhausted, without the need for additional means for fixating the wafer for the wafer processing operation. The wafer is subsequently heated up to a required process temperature for the wafer processing operation by the wafer heating system.

The methods of pressurizing the process chamber before heating the wafer as disclosed in the present disclosure advantageously minimize wafer warpage, thereby allowing the wafer to be evenly heated for the wafer processing operation and achieving improved product reliability.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by language of approximation, such as "about", "approximately", and "substantially", and are not to be limited to the precise value specified. The language of approximation may correspond to the precision of an instrument used to measure the value and, unless otherwise dependent on the precision of the instrument, may indicate +/−10% of the stated value(s).

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A system for processing a semiconductor wafer, the system comprising:
   a heating system for heating a chuck;
   a pressure control system for setting an internal chamber pressure of a process chamber to a pressure level higher than an ambient pressure; and
   a gas flow system for inflowing a gas in the process chamber to increase the internal chamber pressure, wherein the heating system heats the chuck after the internal chamber pressure reaches at least a base pressure set by the pressure control system.

2. The system of claim 1, wherein the pressure control system controls the amount of gas inflowing to the process chamber from the gas flow system.

3. The system of claim 1, wherein the internal chamber pressure is set to a pressure level lower than a process pressure of a wafer processing operation.

4. The system of claim 1, wherein the internal chamber pressure is set to a process pressure of a wafer processing operation.

5. The system of claim 1, wherein the heating system comprises a heating element in the chuck.

6. The system of claim 1, wherein the gas comprises a process gas for a wafer processing operation.

7. The system of claim 1, wherein the gas comprises an inert gas.

8. The system of claim 1, wherein the gas comprises deuterium.

9. A method for processing a semiconductor wafer, the method comprising:
provisioning a process chamber having a chuck therein;
setting an internal chamber pressure to at least a base pressure higher than an ambient pressure; and
heating the chuck after the process chamber reaches the base pressure.

10. The method of claim 9, wherein setting the internal chamber pressure comprises inflowing a gas into the process chamber.

11. The method of claim 9, wherein internal chamber pressure is set to a pressure level lower than a process pressure for a wafer processing operation.

12. The method of claim 9, wherein the internal chamber pressure is set to a process pressure of a wafer processing operation.

13. The method of claim 9, wherein heating the chuck comprises activating a heating element in the chuck.

14. The method of claim 9, further comprising performing a high-pressure wafer processing operation on the wafer.

15. A semiconductor processing tool, the tool comprising:
a process chamber for a high-pressure wafer processing operation, wherein an internal chamber pressure can be set to at least a base pressure higher than an ambient pressure; and
a chuck in the process chamber, the chuck having grooves in the chuck surface that terminate in the chuck, wherein when a wafer is placed on the chuck, air pockets are formed in the grooves having an air pressure lower than the base pressure.

16. The tool of claim 15, wherein the chuck further comprises a heating element, the heating element is activated after the internal chamber pressure reaches the base pressure.

17. The tool of claim 15, wherein the high-pressure wafer processing operation comprises a diffusion process.

18. The tool of claim 15, wherein the high-pressure wafer processing operation comprises an annealing process.

* * * * *